US008878211B2

(12) United States Patent
Hwang et al.

(10) Patent No.: US 8,878,211 B2
(45) Date of Patent: Nov. 4, 2014

(54) HETEROGENEOUS SUBSTRATE, NITRIDE-BASED SEMICONDUCTOR DEVICE USING SAME, AND MANUFACTURING METHOD THEREOF

(75) Inventors: Sung Min Hwang, Yongin-si (KR); Kwang Hyeon Baik, Seoul (KR); Yong Gon Seo, Seongnam-si (KR); Hyung Do Yoon, Seongnam-si (KR); Jae Hyoun Park, Suwon-si (KR)

(73) Assignee: Korea Electronics Technology Institute, Seongnam-Si, Gyeonggi-Do (KR)

( * ) Notice: Subject to any disclaimer, the term of this patent is extended or adjusted under 35 U.S.C. 154(b) by 462 days.

(21) Appl. No.: 13/327,647

(22) Filed: Dec. 15, 2011

(65) Prior Publication Data

US 2012/0086017 A1  Apr. 12, 2012

Related U.S. Application Data

(63) Continuation of application No. PCT/KR2010/003828, filed on Jun. 15, 2010.

(30) Foreign Application Priority Data

Jun. 15, 2009  (KR) .................. 10-2009-0053115
Mar. 31, 2010  (KR) .................. 10-2010-0029342

(51) Int. Cl.
*H01L 33/16* (2010.01)
*H01L 21/02* (2006.01)
*H01L 33/00* (2010.01)
*H01L 33/22* (2010.01)

(52) U.S. Cl.
CPC ...... *H01L 21/0254* (2013.01); *H01L 21/02488* (2013.01); *H01L 21/02458* (2013.01); *H01L 21/02502* (2013.01); *H01L 21/0237* (2013.01); *H01L 21/02639* (2013.01); *H01L 33/007* (2013.01); *H01L 33/22* (2013.01)
USPC ................ 257/96; 438/47; 438/481

(58) Field of Classification Search
CPC ............ H01L 21/02516; H01L 21/0254; H01L 21/02593; H01L 21/02598
USPC ........................ 257/96; 438/47, 481
See application file for complete search history.

(56) References Cited

U.S. PATENT DOCUMENTS 6,860,943 B2 *  3/2005  Koike et al. .............. 117/102
6,864,160 B2 *  3/2005  Linthicum et al. ......... 438/479

(Continued)

FOREIGN PATENT DOCUMENTS

JP  2000-164929  6/2000
JP  2008-034862  2/2008
KR  10-2007-0093691  9/2007

OTHER PUBLICATIONS

International Search Report mailed Dec. 30, 2010 for PCT/KR2010/003828.

*Primary Examiner* — George Fourson, III
(74) *Attorney, Agent, or Firm* — Lowe Hauptman & Ham, LLP

(57) ABSTRACT

Provided are a heterogeneous substrate, a nitride-based semiconductor device using the same, and a manufacturing method thereof to form a high-quality non-polar or semi-polar nitride layer on a non-polar or semi-polar plane of the heterogeneous substrate by adjusting a crystal growth mode. A base substrate having one of a non-polar plane and a semi-polar plane is prepared, and a nitride-based nucleation layer is formed on the plane of the base substrate. A first buffer layer is grown faster in the vertical direction than in the lateral direction on the nucleation layer. A lateral growth layer is grown faster in the lateral direction than in the vertical direction on the first buffer layer. A second buffer layer is formed on the lateral growth layer. A silicon nitride layer having a plurality of holes may be formed between the lateral growth layer on the first buffer layer and the second buffer layer.

29 Claims, 16 Drawing Sheets

(56) References Cited

U.S. PATENT DOCUMENTS

| | | | |
|---|---|---|---|
| 7,141,444 B2 * | 11/2006 | Koike et al. | 438/34 |
| 7,361,576 B2 * | 4/2008 | Imer et al. | 438/479 |
| 7,462,867 B2 * | 12/2008 | Tezen | 257/79 |
| 7,560,725 B2 * | 7/2009 | Koike et al. | 257/12 |
| 7,727,332 B2 * | 6/2010 | Habel et al. | 117/88 |
| 7,790,584 B2 * | 9/2010 | Paek et al. | 438/507 |
| 7,955,983 B2 * | 6/2011 | Imer et al. | 438/698 |
| 7,956,360 B2 * | 6/2011 | Haskell et al. | 257/64 |
| 8,148,178 B2 * | 4/2012 | Paek et al. | 438/22 |
| 8,415,682 B2 * | 4/2013 | Nakanishi et al. | 257/79 |
| 8,617,945 B2 * | 12/2013 | Hudait et al. | 438/172 |
| 2005/0076828 A1 * | 4/2005 | Taki et al. | 117/89 |
| 2008/0135853 A1 * | 6/2008 | Craven et al. | 257/76 |

\* cited by examiner

HETEROGENEOUS SUBSTRATE, NITRIDE-BASED SEMICONDUCTOR DEVICE USING SAME, AND MANUFACTURING METHOD THEREOF

CROSS REFERENCE TO RELATED APPLICATION

The present application is a continuation of International Application Number PCT/KP2010/003828 filed Jun. 15, 2010, the disclosure of which is hereby incorporated by reference herein in their entirety. Further, this application claims the priority of Korean Patent Application No. 10-2009-0053115, filed on Jun. 15, 2009 in the KIPO (Korean Intellectual Property Office), and Korean Patent Application No. 10-2010-0029342, filed on Mar. 31, 2010 in the KIPO (Korean Intellectual Property Office), the disclosure of which are incorporated herein in their entirety by reference.

TECHNICAL FIELD

The present invention relates to a semiconductor device and a manufacturing method thereof, and more particularly, to a heterogeneous substrate formed in such a manner that a high-quality non-polar or semi-polar nitride layer is formed on a non-polar or semi-polar plane of a heterogeneous board such as a sapphire board by adjusting a growth control mode, a nitride-based semiconductor device using the same, and a manufacturing method thereof.

BACKGROUND ART

Most nitride-based single crystal semiconductor substrates such as GaN, used as a base when a semiconductor device is manufactured, are c-plane ({0001} plane) nitride thin films and are obtained by growing a nitride on a c-plane ({0001} plane) of a sapphire board through Metal Organic Chemical Vapor Deposition (MOCVD), Molecular Beam Epitaxy (MBE) or Hydride Vapor Phase Epitaxy (HVPE).

A c-plane nitride-based single crystal layer formed in this manner has polarity since gallium and nitrogen, for example, are repeatedly deposited in the direction of c crystal axis. In the case of a c-plane GaN/AlGaN/InGaN heterostructure, for example, a strong electric field generated by spontaneous polarization or piezoelectric polarization tilts the electronic band structure in the heterostructure so as to reduce a carrier recombination rate, resulting in a reduction in quantum efficiency.

Specifically, polarization discontinuity is present in the c-crystal axis growth direction to generate sheet charges fixed to the surface or interface, and the resultant internal electric field separates electron and hole wavefunctions from each other to move an emission wavelength to a long wavelength and when an electric field is applied, the emission wavelength is moved to a short wavelength. This makes it difficult to develop devices for long-wavelengths.

On the other hand, a-plane ({11-20} plane) and m-plane ({1-100} plane) nitride-based crystals can overcome the above-described problem of the c-plane nitride-based single crystal, that is, the problem that quantum efficiency is decreased due to an internal electric field caused by polarization because the a-plane and m-plane nitride-based crystals have non-polar characteristics. The a-plane nitride-based crystals do not generate band bending since they have no polarization field, and stark effect is not observed in a structure having an AlGaN/GaN/InGaN quantum well formed on a non-polar crystal plane. Accordingly, an a-plane non-polar nitride-based heterostructure has a possibility that it can be used for high-efficiency light-emitting elements of an ultra-visible ray region and High Electron Mobility Transistor (HEMT).

Furthermore, an a-plane nitride-based layer can be doped in a concentration higher than that of a c-plane nitride-based single crystal layer because activation energy of the a-plane is 118 meV while that of the c-plane is 170 meV much higher than that of the a-plane. In addition, doping efficiency in GaN remarkably decreases as the content of Al in the GaN increases, in general, and thus heavy doping occurs in the a-plane compared to the c-plane.

The non-polar plane nitride-based single crystal layer cannot be manufactured and commercialized as a substrate although it has many advantages over the c-plane crystal layer because it is difficult to obtain a smooth surface and the non-polar plane nitride-based single crystal film has a large amount of internal defects compared to the c-plane crystal layer.

Specifically, an a-plane nitride-based single crystal layer is formed on an r-plane ({1-102} plane) sapphire single crystal base. In this case, a nitride layer having a surface shape in which ridges made of {1010} planes are extended in <0001> direction rather than a flat surface is formed, and strong compressive stress is applied in <1-100> direction of the nitride due to large anisotropy depending on a crystallographic orientation of an in-plane thermal expansion coefficient in addition to anisotropy of a lattice constant.

When this a-plane nitride-based single crystal is grown into a thick film or thin film, a film having no coalescence of ridges is formed to result in generation of a large amount of defects in the film. Poor surface shapes and defects make it difficult to manufacture devices and they are present on the surface of a substrate so as to deteriorate the performance of a final thin film device.

Technical Problem

An object of the present invention is to provide a heterogeneous substrate on which a nitride is deposited, which is able to planarize the surface of a nitride layer on a non-polar or semi-polar plane and reduce the amount of internal defects using multiple buffer layers, a nitride-based semiconductor device using the same, and a manufacturing method thereof.

Another object of the present invention is to provide a heterogeneous substrate on which a nitride is deposited, which is able to easily form a nitride layer having a flat surface on a non-polar or semi-polar plane thereof to thereby improve yield, a nitride-based semiconductor device using the same, and a manufacturing method thereof.

Technical Solution

To accomplish the objects of the present invention, the present invention provides a heterogeneous substrate including a high-quality nitride layer formed on a non-polar or semi-polar plane thereof by adjusting a crystal growth mode, a semiconductor device using the same, and a manufacturing method thereof.

A heterogeneous substrate according to an aspect of the present invention includes a base substrate, a nucleation layer, a first buffer layer, a lateral growth layer, and a second buffer layer. The base substrate has one of a non-polar plane and a semi-polar plane. The nucleation layer is formed on the plane of the base substrate. The first buffer layer is formed on the nucleation layer and it is grown faster in a vertical direction than in a lateral direction. The lateral growth layer is formed on the first buffer layer and it is grown faster in the lateral direction than in the vertical direction. The second buffer layer is grown on the lateral growth layer.

The heterogeneous substrate may further include at least one silicon nitride ($SiN_x$) layer having a plurality of holes, which is formed at an interface of the first buffer layer, the lateral growth layer or the second buffer layer, or in the first buffer layer, the lateral growth layer or the second buffer layer. Here, crystals beneath the silicon nitride layer are grown through the holes of the silicon nitride layer to cover the silicon nitride layer.

A method for manufacturing a heterogeneous substrate on which a nitride is deposited according to another aspect of the present invention includes the steps of preparing a base substrate having one of a non-polar plane and a semi-polar plane, forming a nitride-based nucleation layer on the plane of the base substrate, forming a first buffer layer on the nucleation layer such that the first buffer layer is grown faster in a vertical direction than in a lateral direction, forming a lateral growth layer on the first buffer layer such that the lateral growth layer is grown faster in the lateral direction than in the vertical direction, and growing a second buffer layer on the lateral growth layer.

A nitride-based semiconductor device using the heterogeneous substrate on which a nitride is deposited according to another aspect of the present invention includes the above-described heterogeneous substrate on which a nitride is deposited, an n-type or p-type first nitride layer formed on the second buffer layer, an active layer formed on the first nitride layer, and a second nitride layer formed on the active layer and having a conductivity type opposite to that of the first nitride layer.

Advantageous Effects

According to the present invention, it is possible to form a non-polar or semi-polar plane nitride layer having a flat surface and a small amount of internal defects on a non-polar or semi-polar plane of a base substrate by adjusting a crystal growth mode. Specifically, a nucleation layer is formed on the base substrate, a first buffer layer is formed on the nucleation layer such that the first buffer layer is grown faster in the vertical direction than in the lateral direction, a lateral growth layer is formed on the first buffer layer such that the lateral growth layer is grown faster in the lateral direction than in the vertical direction, and then a second buffer layer is formed on the lateral growth layer, to thereby form the non-polar or semi-polar plane nitride layer having a flat surface and a small amount of internal defects on the non-polar or semi-polar plane of the base substrate.

In particular, a silicon nitride layer having a plurality of holes is formed between the lateral growth layer on the first buffer layer and the second buffer layer, and then crystals are grown through portions exposed through the holes of the silicon nitride layer. Accordingly, growth of crystals in the lateral direction is promoted so as to form an a-plane nitride layer having a flat surface and a small amount of internal defects.

MODE FOR INVENTION

The present invention will now be described more fully with reference to the accompanying drawings, in which exemplary embodiments of the invention are shown.

Figure 1:
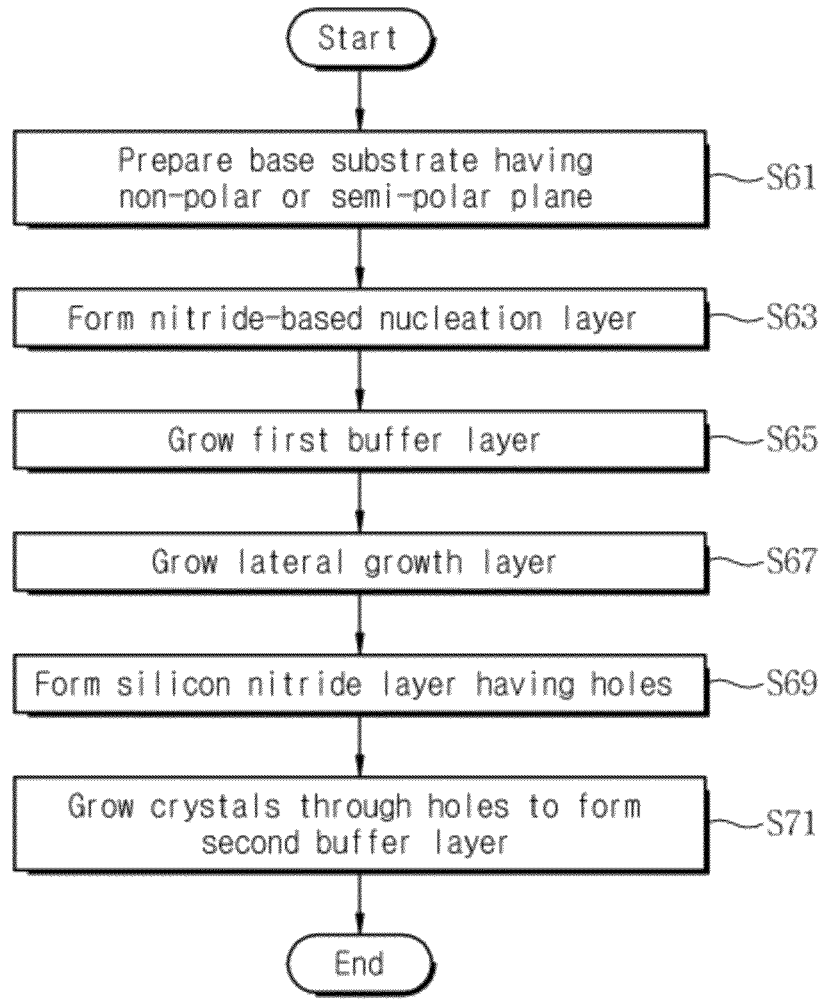
FIG. 1 is a flowchart illustrating a method for manufacturing a heterogeneous substrate on which a nitride is deposited according to an embodiment of the present invention.

A method for manufacturing a heterogeneous substrate on which a nitride is deposited according to an embodiment of the present invention will be explained with reference to FIGS. 1 to 8. FIG. 1 is a flowchart illustrating the method for manufacturing a heterogeneous substrate on which a nitride is deposited according to an embodiment of the present invention and FIGS. 2 to 8 are views showing respective steps of the manufacturing method shown in FIG. 1.

Figure 2:
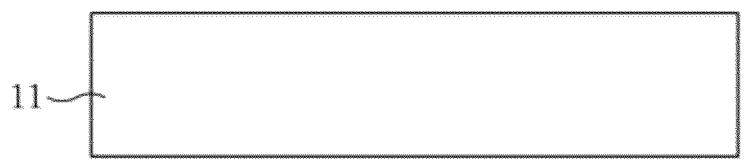
FIGS. 2 to 8 are views showing respective steps of the manufacturing method shown in FIG. 1.

Referring to FIG. 2, a base substrate 11 having one of a non-polar plane and a semi-polar plane is prepared (S61). A sapphire board may be used as the base substrate 11, and a SiC, ZnO or Si substrate may also be used. Here, planes other than c-plane, that is, a-plane, r-plane, m-plane, etc. can be used as the non-polar or semi-polar plane. In the current embodiment, a sapphire board having r-plane is used as the base substrate 11.

An a-plane nitride layer 18 including a nucleation layer 12, a first buffer layer 13, a lateral growth layer 14, a silicon nitride layer 15, and a second buffer layer 17 is formed on the plane of the base substrate 11. The a-plane nitride layer 18 may be formed using MOCVD, MBE or HVPE. The a-plane nitride layer 18 is formed using MOCVD in the current embodiment.

Figure 3:
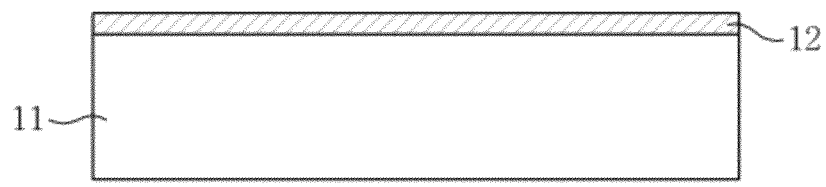

Referring to FIG. 3, the nucleation layer 12 is formed on the plane of the base substrate 11 (S63). Here, the nucleation layer 12 is formed in a nitrogen or hydrogen ambient at a pressure in the range of 30 to 760 torr, a V/III ratio in the range of 50 to 3000 and a temperature in the range of 450 to 1300° C. The thickness of the nucleation layer 12 affects crystallinity of the a-plane nitride layer 18 formed thereon, and thus the nucleation layer 12 is formed to a thickness in the range of 5 to 700 nm, preferably, in the range of 70 to 250 nm. Here, the nitride-based nucleation layer 12 may be formed of one of GaN, $Al_xGa_{1-x}N$ and $In_xGa_{1-y}N$ (0<x, y>1). The nitride-based nucleation layer 12 uses a-plane GaN in the current embodiment of the invention.

Figure 4:
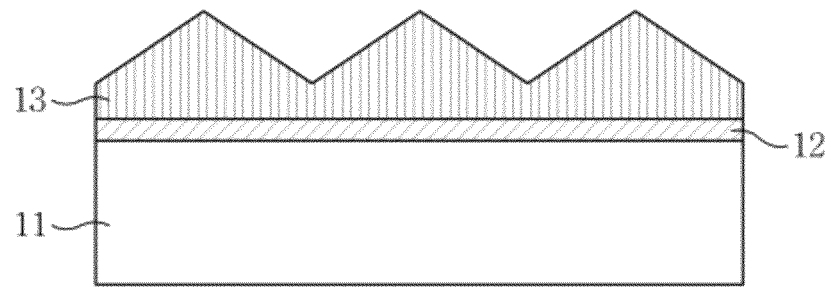

Referring to FIG. 4, the first buffer layer 13 is formed on the nucleation layer 12 (S65). The first buffer layer 13 is grown on the nucleation layer 12 faster in the vertical direction than in the lateral direction. The first buffer layer 13 is grown in an ambient at a V/III ratio in the range of 50 to 2000, a pressure in the range of 100 to 760 torr and a temperature in the range of 450 to 1300° C. Although the first buffer layer 13 grown under this condition has a rough surface, a full width of half maximum (FWHM) value of the a-plane scanned with X-Ray Diffraction (XRD) in a direction parallel with m axis is reduced.

Figure 5:
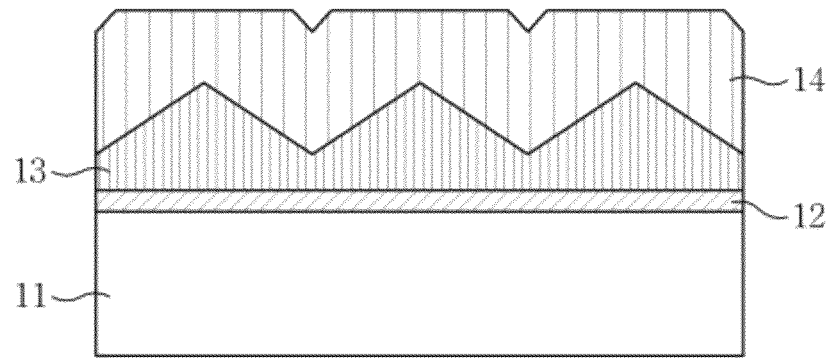

Referring FIG. 5, the lateral growth layer 14 is formed on the first buffer layer 13. The lateral growth layer 14 is grown faster in the lateral direction than in the vertical direction. The lateral growth layer 14 is grown at a V/III ratio in the range of 2 to 1000, a temperature in the range of 800 to 1500° C. and a pressure in the range of 10 to 300 torr. The lateral growth layer 14 is grown at a V/III ratio lower than that of the first buffer layer 13. The lateral growth layer 14 formed under this condition has a mirror-like surface and an FWHM value of the a-plane scanned with XRD in a direction parallel with c axis is reduced. This shows that GaN grown in the c-axis direction has satisfactory crystallinity. In addition, it can be confirmed that an FWHM value of the a-plane scanned with XRD in a direction parallel with c axis is reduced.

Figure 6:
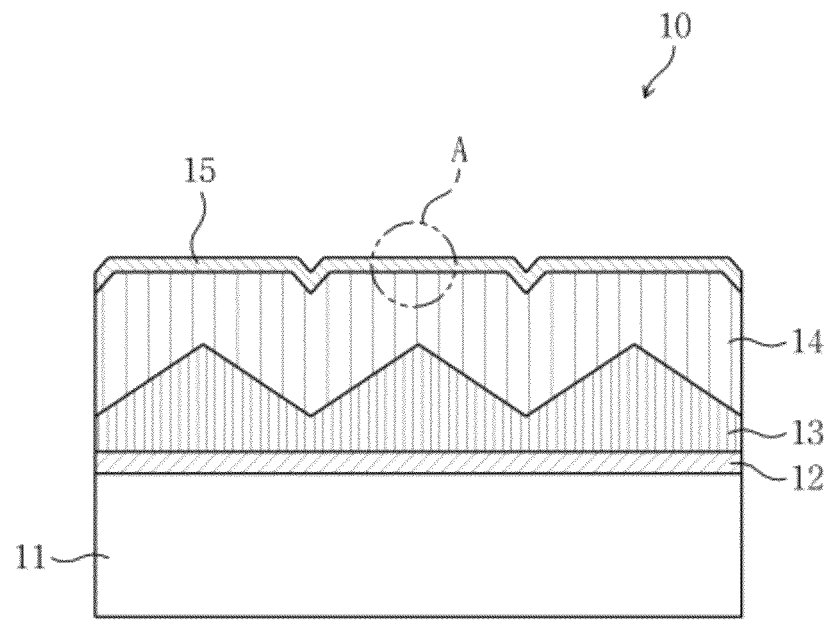
Figure 7:
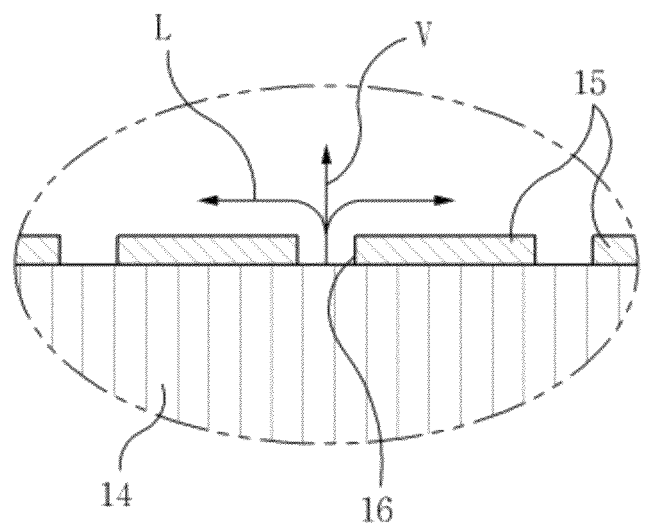

Referring to FIGS. 6 and 7, a silicon nitride ($SiN_x$) layer 15 having a plurality of holes 16 is formed on or in the lateral growth layer 14 or at the interface between the first buffer layer and the lateral growth layer (S69). That is, the silicon nitride layer 15 is formed on or in the lateral growth layer 14, or at the interface between the first buffer layer and the lateral growth layer using $SiH_4$, or $Si_2H_6$ and $NH_3$ in a state that supply of III-group elements, Ga, In and Al, is interrupted in MOCVD equipment. At this time, the silicon nitride layer 15 generates the plurality of holes 16 by itself and exposes the lateral growth layer 14 formed therebeneath through the holes 16.

Figure 8:
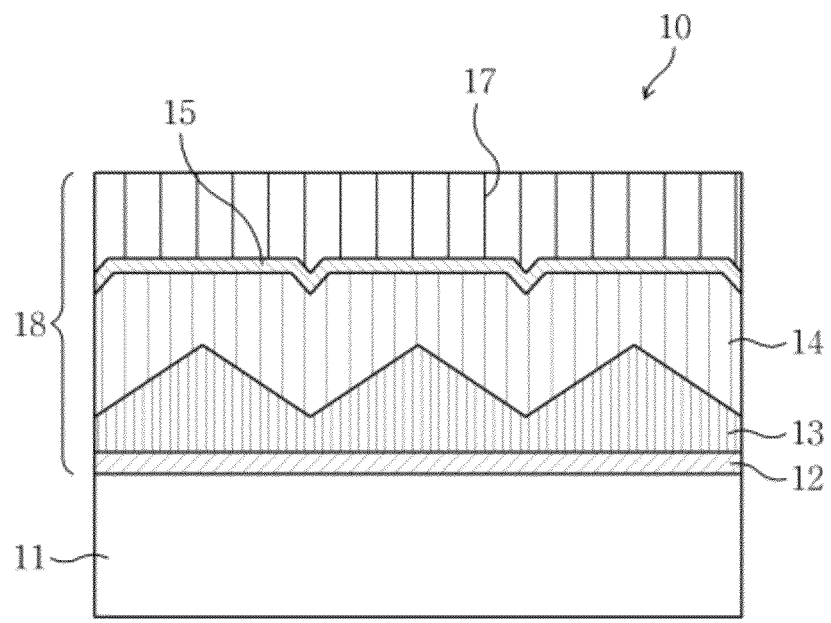

Referring to FIG. 8, the second buffer layer 17 covering the silicon nitride layer 15 is formed to complete a heterogeneous substrate 10 on which a nitride is deposited (S71). The second buffer layer 17 is grown in an ambient at a V/III ratio in the range of 50 to 2000, a temperature in the range of 450 to 1300° C., and a pressure in the range of 30 to 760 torr, and doped with Si for an n-type semiconductor if required. The second buffer layer 17 needs to have lateral and vertical growth rates equal to each other or a lateral growth rate higher than a vertical growth rate. It can be confirmed that the second buffer layer 17 grown under this condition maintains a mirror-like surface and improved crystallinity. The nucleation layer 12, the first buffer layer 13, the lateral growth layer 14, the silicon nitride layer 15 and the second buffer layer 17, formed on the base substrate 11, form the a-plane nitride layer 18.

Particularly, the second buffer layer 17 or the lateral growth layer is grown on the layer 14 exposed through the holes 16 of the silicon nitride layer 15 to cover the silicon nitride layer 15. That is, crystals are not directly grown on the silicon nitride layer 15 and they are grown through portions of the layer 14, exposed via the holes 16 of the silicon nitride layer 15. At this time, the crystals are grown faster in the lateral direction L than in the vertical direction V, as shown in FIGS. 7 and 8 to cover the silicon nitride layer 15, and thus the second buffer layer 17 having a flat surface is formed and crystallinity thereof is improved.

In the current embodiment as described above, it is possible to form the a-plane nitride layer 18 having a flat surface and a small amount of internal defects on the non-polar or semi-polar plane of the base substrate 11 by controlling the crystal growth mode. That is, the nucleation layer 12 is formed on the base substrate 11, the first buffer layer 12 is formed on the nucleation layer 12 such that it is grown faster in the vertical direction than in the lateral direction, the lateral growth layer 14 is formed on the first buffer layer 12 such that it is grown faster in the lateral direction than in the vertical direction, and then the second buffer layer 17 is formed on the lateral growth layer 14, to thereby form the a-plane nitride layer 18 having a flat surface and a small amount of internal defects on the base substrate 11.

Particularly, the silicon nitride layer 15 having the plurality of holes 16 is formed between the lateral growth layer 14 on the first buffer layer 13 and the second buffer layer 17, and then crystals are grown through the holes of the silicon nitride layer 15 to promote growth of crystals in the lateral direction, thereby forming the a-plane nitride layer 18 having a flat surface and a small amount of internal defects.

While the silicon nitride layer 15 is formed on the lateral growth layer 14 in step S69 in the current embodiment, the present invention is not limited thereto. For example, the silicon nitride layer 15 may be formed on the interface of the first buffer layer, lateral growth layer or the second buffer layer, or in the first buffer layer, lateral growth layer or the second buffer layer. That is, the silicon nitride layer can be formed in the lateral growth layer. Specifically, a first lateral growth layer is formed on the first buffer layer, and then the silicon nitride layer having a plurality of holes uniformly distributed therein is formed on the first lateral growth layer. The first lateral growth layer exposed through the holes of the silicon nitride layer is grown to form a second lateral growth layer covering the silicon nitride layer.

Otherwise, the silicon nitride layer may be formed in the second buffer layer. Specifically, a (2-1)th buffer layer is formed on the lateral growth layer, and then the silicon nitride layer having a plurality of holes uniformly distributed therein is formed on the (2-1)th buffer layer. Subsequently, the (2-1)th buffer layer exposed through the holes of the silicon nitride layer is grown to form a (2-2)th buffer layer covering the silicon nitride layer.

Preferably, the silicon nitride layer 15 is formed between the lateral growth layer 14 on the first buffer layer 13 and the second buffer layer 17. Alternatively, the silicon nitride layer may not be formed when the a-plane nitride layer is formed on the r-plane of the base substrate 11.

The heterogeneous substrate 10 manufactured according to the current embodiment of the invention uses the r-plane sapphire board as the base substrate 11 and has the a-plane nitride layer 18 formed on the r-plane of the sapphire board. Here, the a-plane nitride layer 18 is formed using GaN. It can be confirmed from FIGS. 9 to 13 that the heterogeneous substrate 10 manufactured according to the current embodiment of the invention has the a-plane nitride layer 18 having a flat surface and a small amount of internal defects, formed on the r-plane of the base substrate 11.

Figure 9:
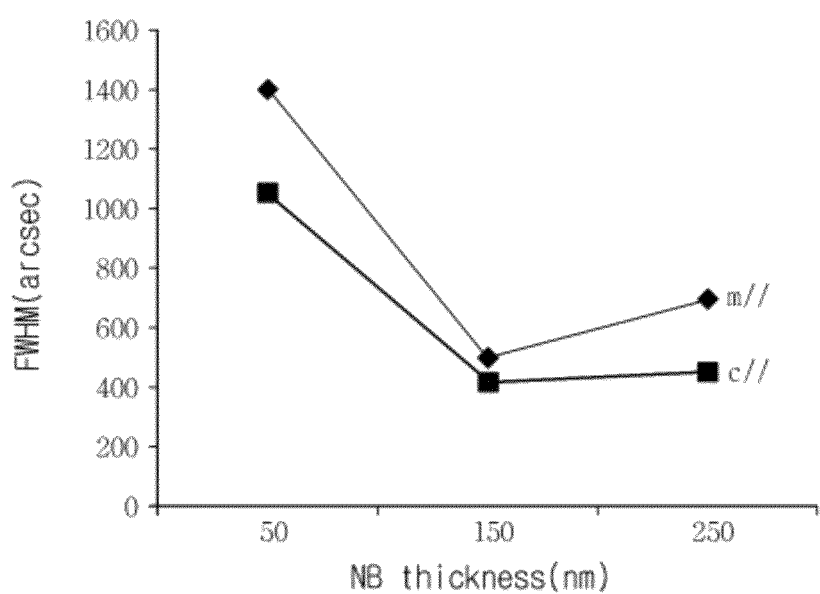
FIG. 9 is a graph showing a relationship between an FWHM value and the thickness of a nucleation layer of FIG. 8.

Furthermore, it can be confirmed from FIG. 9 that the nucleation layer 12 has satisfactory crystallinity at a point of 150 nm in thickness. FIG. 9 is a rocking curve showing a relationship between an FWHM value and the thickness of the nucleation layer 12.

Figure 10:
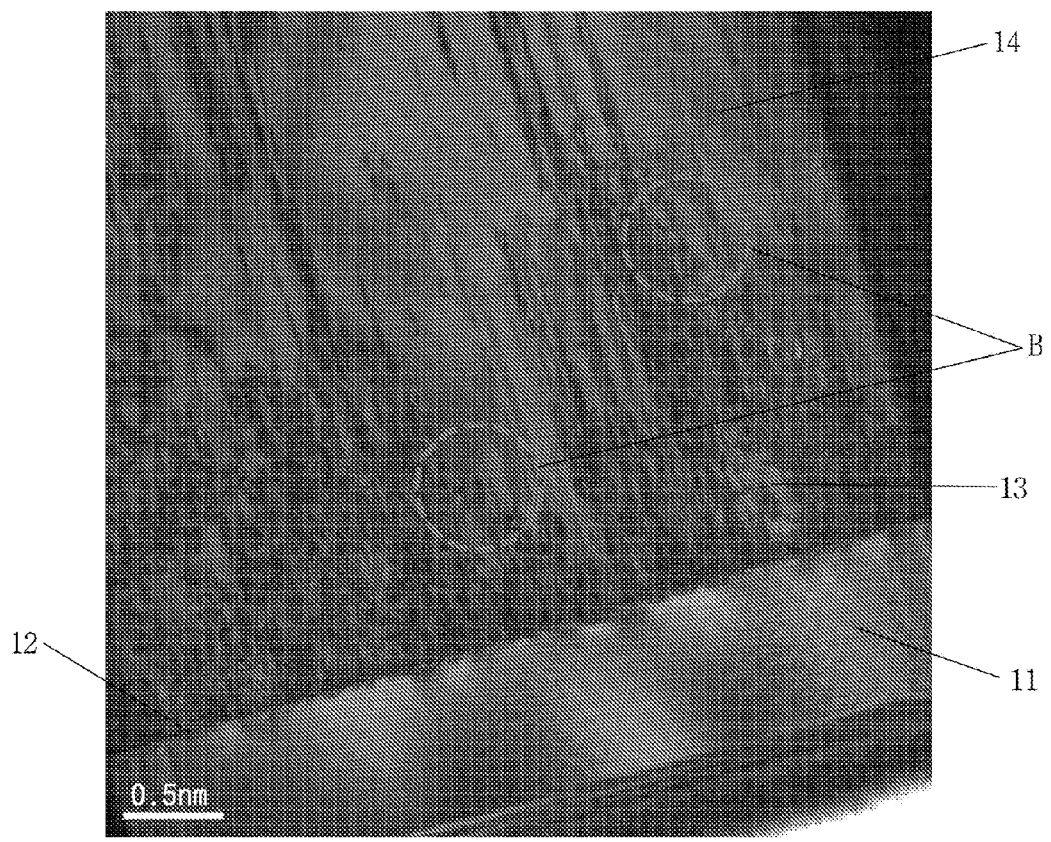
FIG. 10 is a SEM photograph showing a first buffer layer and a lateral growth layer of the heterogeneous substrate on which a nitride is deposited, shown in FIG. 8.

When the first buffer layer 13 and the lateral growth layer 14 are sequentially grown, the first buffer layer 13 is grown at a V/III ratio and pressure higher than those at which the lateral growth layer 14 is formed. In this case, it can be easily confirmed from FIG. 10 that the amount of internal defects at the interface between the first buffer layer 13 and the lateral growth layer 14 is reduced. Here, FIG. 10 is a Transmission Electron Microscope (TEM) photograph showing the first buffer layer 13 and the lateral growth layer 14 of the heterogeneous substrate 10 on which a nitride is deposited.

Figure 11:
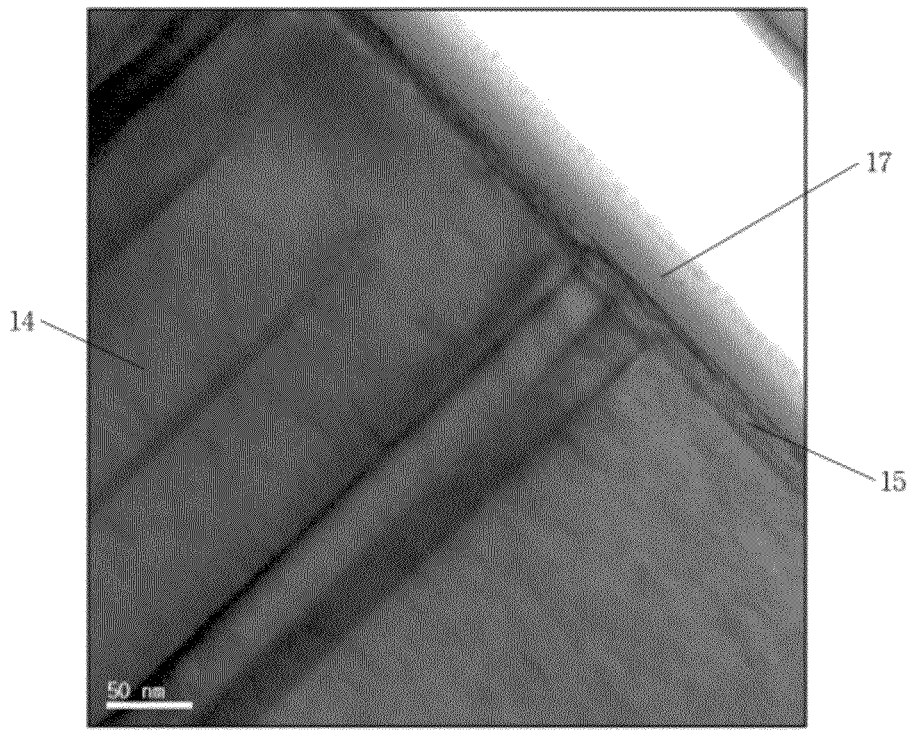
FIG. 11 is a SEM photograph showing the lateral growth layer and a second buffer layer of the heterogeneous substrate on which a nitride is deposited, shown in FIG. 8.

The second buffer layer 17 is grown under a process condition similar to the growth condition of the first buffer layer 13. In this case, it can be confirmed that the second buffer layer 17 has a flat surface and barely has defects, as shown in FIG. 11. FIG. 11 is a TEM photograph showing that the second buffer layer 17 of the heterogeneous substrate 10 on which a nitride is deposited, shown in FIG. 8, barely has defects.

Figure 12:
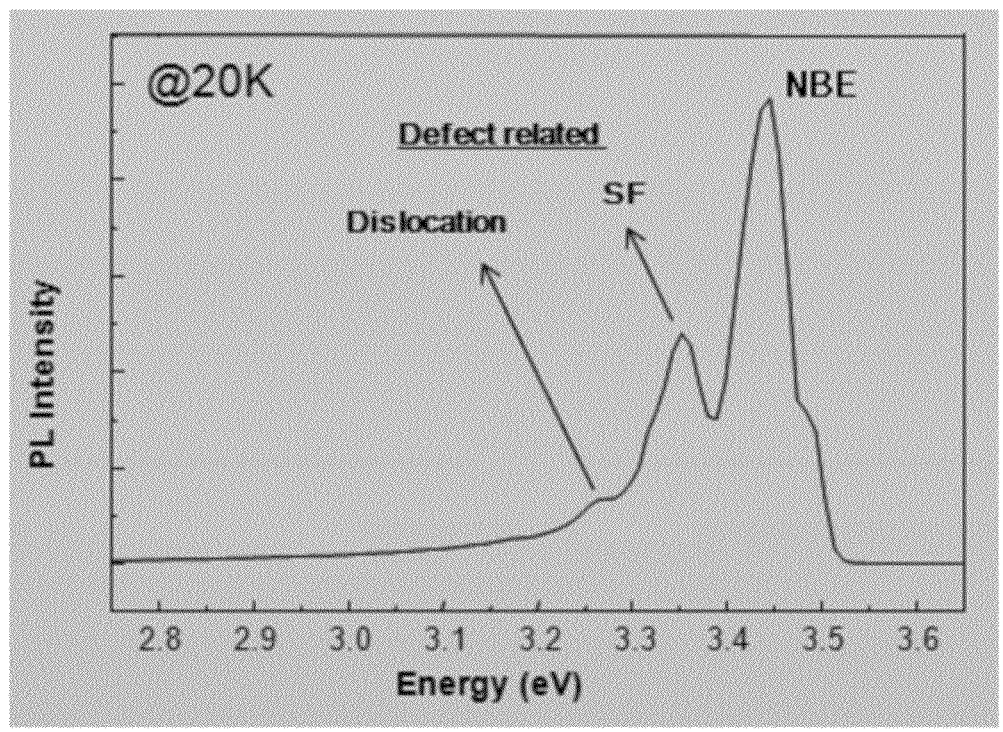
FIG. 12 is a graph showing a PL result measured at 20K in the heterogeneous substrate on which a nitride is deposited, shown in FIG. 8.

FIG. 12 is a graph showing a Photoluminescence (PL) result measured at 20K. Referring to FIG. 12, it can be confirmed that the heterogeneous substrate on which a nitride is deposited has a highest peak intensity at a band edge.

Figure 13:
FIG. 13 an AFM photograph of the surface of the heterogeneous substrate on which a nitride is deposited, shown in FIG. 8.

FIG. 13 is an Atomic Force Microscope (AFM) photograph of a 10 μm×10 μm surface of the heterogeneous substrate on which a nitride is deposited. It can be confirmed from FIG. 13 that the heterogeneous substrate has a very flat surface with a Root Mean Square (RMS) of approximately 1.2 nm.

The above-mentioned heterogeneous substrate on which a nitride is deposited according to the current embodiment of the invention can be used as a substrate for various electronic devices including light emitting elements such as a Light Emitting Diode (LED), a LD (Laser Diode), etc.

Figure 14:
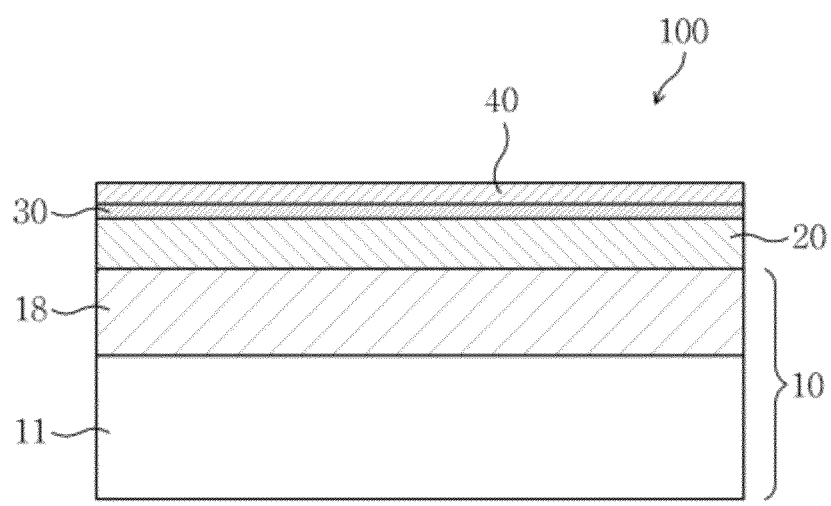
FIG. 14 is cross-sectional view of a nitride-based semiconductor device using the heterogeneous substrate on which a nitride is deposited, shown in FIG. 8.

FIG. 14 is a cross-sectional view of a nitride-based semiconductor device 100 using the heterogeneous substrate 10 on which a nitride is deposited according to the embodiment of the invention.

Referring to FIG. 14, the semiconductor device 100 is a green LED having a structure in which a first nitride layer 20, an active layer 30 and a second nitride layer 40 are sequentially formed on the a-plane nitride layer 18 of the heterogeneous substrate 10 on which a nitride is deposited according to the embodiment of the invention. The a-plane nitride layer 18 has a thickness of about 4 μm. The first nitride layer 20 is an n-type semiconductor including an n-type dopant, and a V-III group nitride-based compound semiconductor of n-GaN group may be used as the first nitride layer 20. The first nitride layer 20 may be formed to a thickness of about 2 μm. The active layer 30 may be formed of InGaN/GaN 4QWs on the first nitride layer 20 to a thickness of 4 nm/10 nm. The second nitride layer is a p-type semiconductor including a p-type dopant, and a V-III group nitride-based compound semiconductor of p-GaN group may be used as the second nitride layer. The second nitride layer 40 may be formed to a thickness of about 150 nm.

Figure 15:
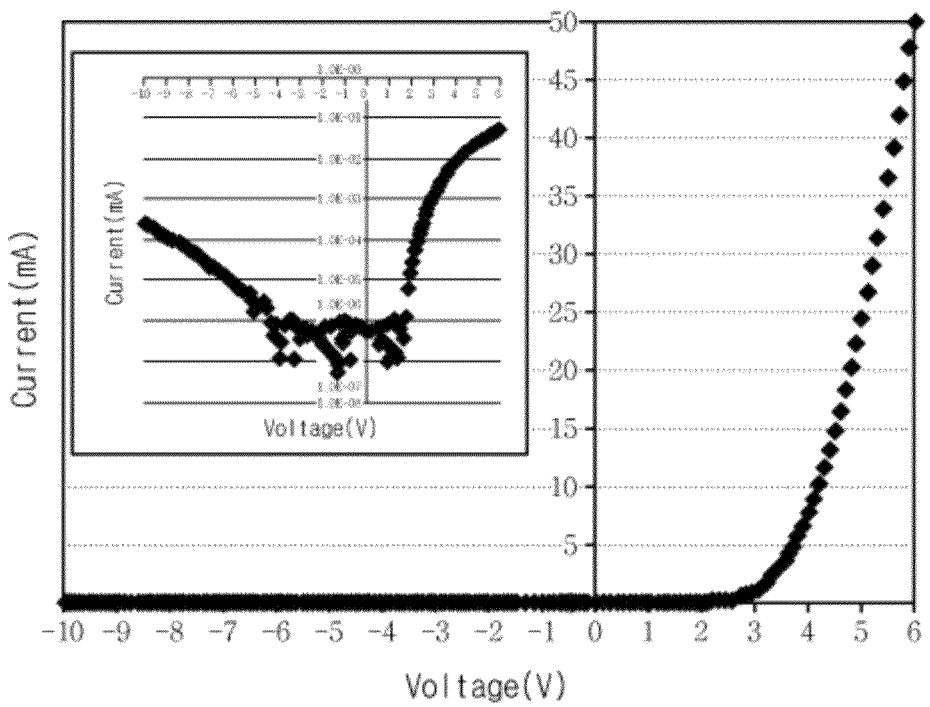
FIG. 15 is a graph showing an I-V curve of the nitride-based semiconductor device shown in FIG. 14.
Figure 16:
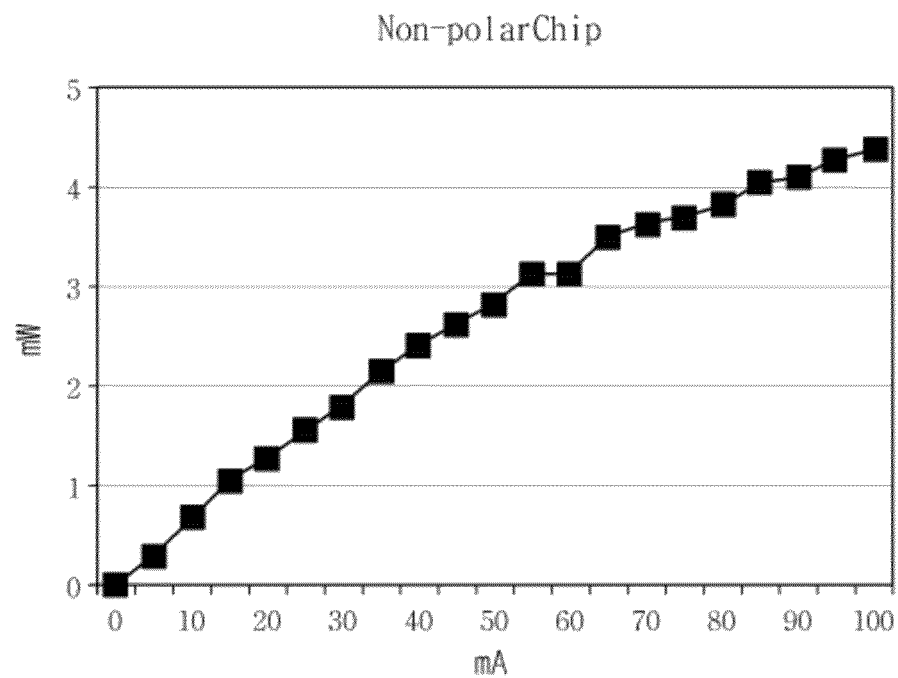
FIG. 16 is a graph showing an L-I curve of the nitride-based semiconductor device shown in FIG. 14.
Figure 17:
FIG. 17 is a photograph showing a light-emitting state when power is applied to the nitride-based semiconductor device shown in FIG. 14.
Figure 18:
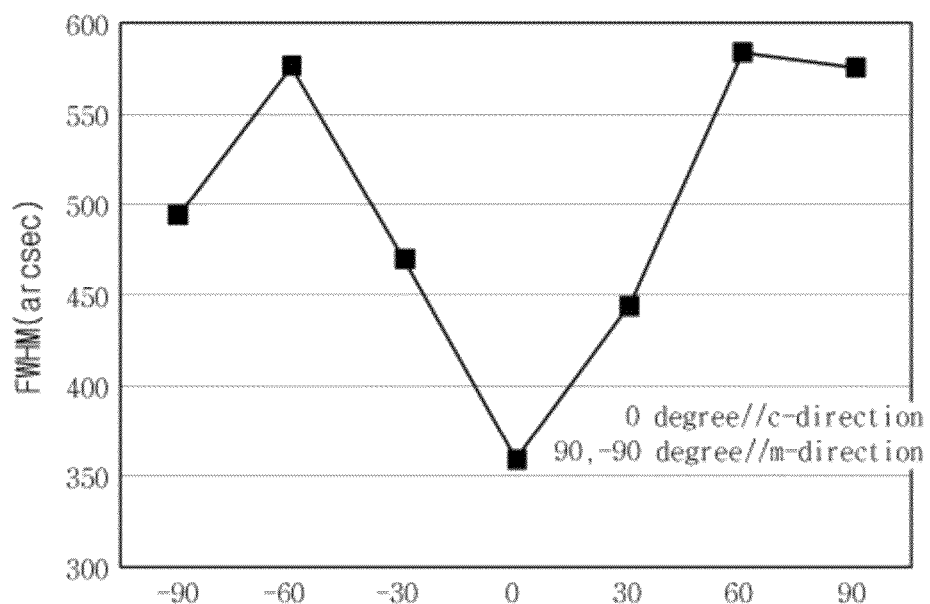
FIG. 18 is a graph showing an FWHM value of an x-ray rocking curve in each orientation of the nitride-based semiconductor device shown in FIG. 14.

It can be confirmed from FIG. 15 that the I-V curve of the nitride-based semiconductor device 100 according to the current embodiment of the invention corresponds to a typical diode curve. In addition, it can be confirmed from FIGS. 16 and 17 that the luminance thereof increases as current increases in an L-I curve. Furthermore, it can be confirmed that the color of light emitted from the nitride-based semiconductor device 100 is varied with the thickness of the active layer 30, concentration of In, etc.

While the n-type first nitride layer 20, the active layer 30 and the p-type second nitride layer 40 are sequentially formed on the a-plane nitride layer 18 in the current embodiment, the present invention is not limited thereto. For example, the nitride-based semiconductor device may have a structure in which a p-type first nitride layer, an active layer and an n-type second nitride layer are formed on the a-plane nitride layer.

Figure 19:
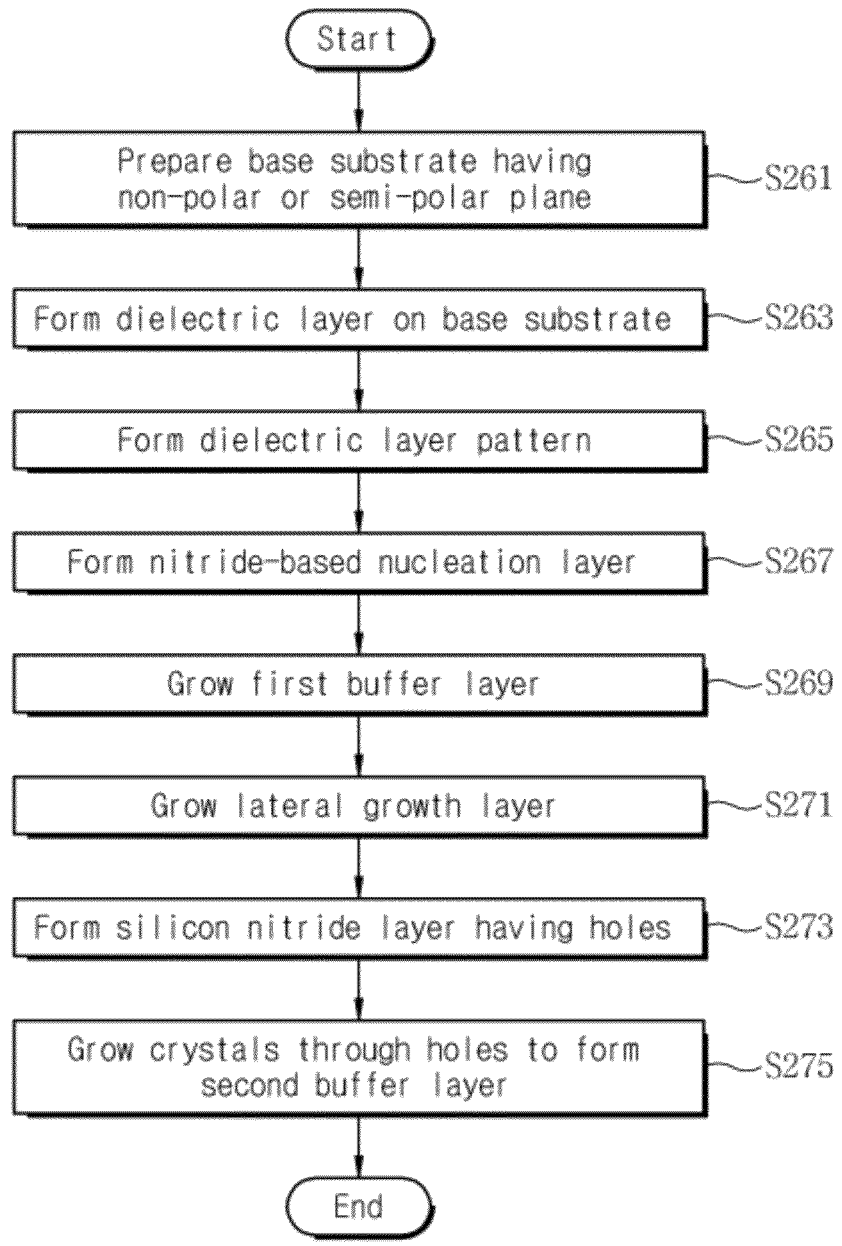
FIG. 19 is a flowchart illustrating a method for manufacturing a heterogeneous substrate on which a nitride is deposited according to another embodiment of the present invention.

A method for manufacturing a heterogeneous substrate on which a nitride is deposited according to another embodiment of the invention will be explained with reference to FIGS. 19 to 24. FIG. 19 is a flowchart illustrating the method for manufacturing a heterogeneous substrate on which a nitride is deposited according to another embodiment of the invention and FIGS. 20 to 24 are views for explaining the method for manufacturing a heterogeneous substrate on which a nitride is deposited according to another embodiment of the invention.

Figure 20:
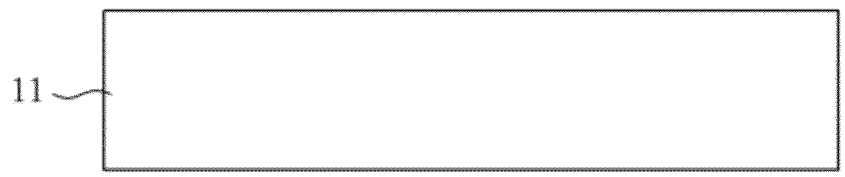
FIGS. 20 to 24 are views for explaining the method for manufacturing a heterogeneous substrate on which a nitride is deposited according to another embodiment of the present invention.

Referring to FIG. 20, the base substrate 11 having one of a non-polar plane and a semi-polar plane is prepared (S261). A sapphire board may be used as the base substrate 11, and a SiC, ZnO or Si substrate may also be used. Here, planes other than c-plane, that is, a-plane, r-plane, m-plane, etc. can be used as the non-polar or semi-polar plane. In the current embodiment, a sapphire board having r-plane is used as the base substrate 11.

Figure 21:
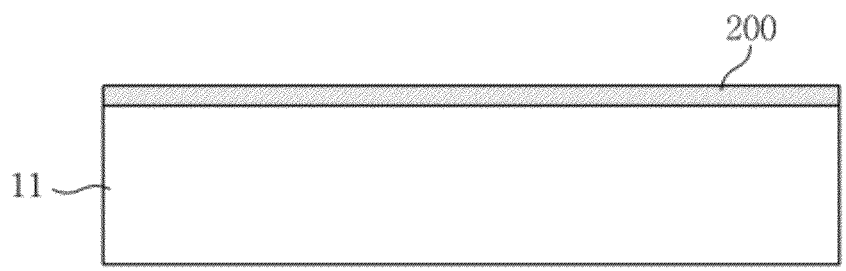
Figure 22:
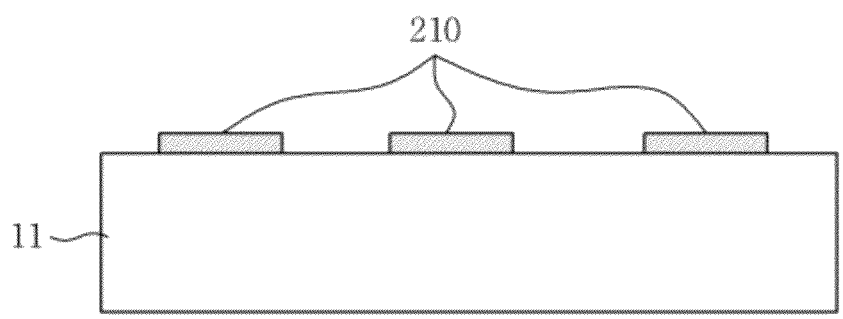
Figure 23:
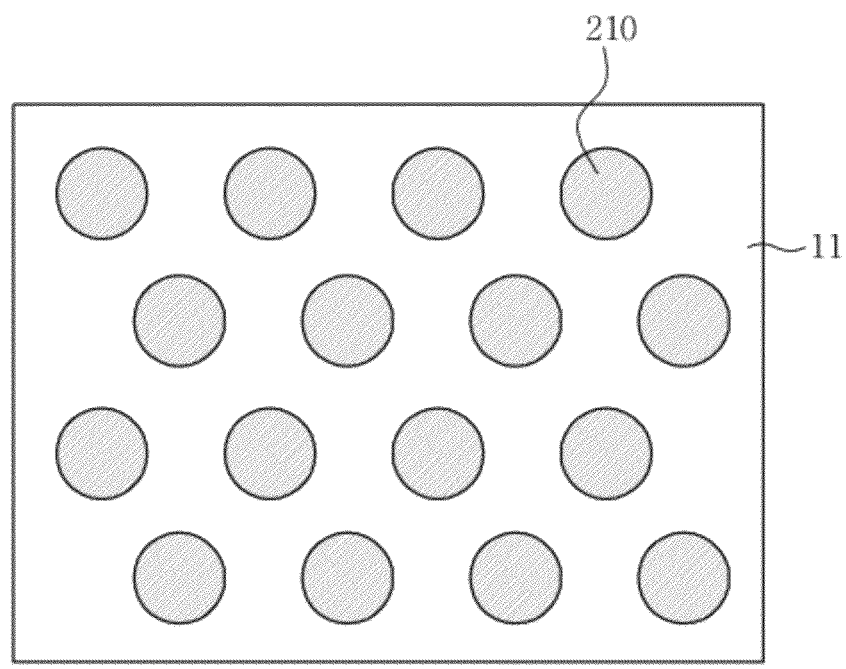
Figure 24:
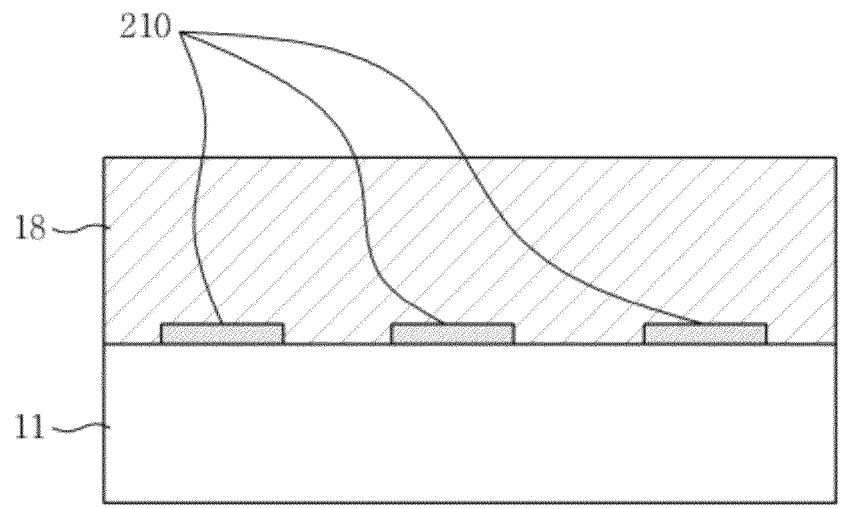

Referring to FIG. 21, a dielectric layer 200 is formed on the base substrate 11 using a dielectric material (S263). The dielectric layer 200 uses a material having a refractive index different from that of the base substrate 11. Here, the dielectric layer may be a SiO₂ layer, SiN layer, etc. Referring to FIG. 22, the dielectric layer 200 is patterned to form a dielectric layer pattern 210 (S265). FIG. 23 shows the dielectric layer pattern 210 formed on the base substrate 11. Specifically, the dielectric layer pattern 210 is formed in such a manner that photoresist is coated on the dielectric layer 200 and selectively removed to expose portions of the dielectric layer 200, which do not correspond to the dielectric layer pattern 210, and then the exposed portions of the dielectric layer 200 are selectively etched.

Referring to FIG. 23, the a-plane nitride layer 18 including the nucleation layer 12, the first buffer layer 13, the lateral growth layer 14, the silicon nitride layer 15 and the second buffer layer 17 is formed on the base substrate 11 on which the dielectric layer pattern 210 is formed. The a-plane nitride layer 18 may be formed using MOCVD, MBE or HVPE. The a-plane nitride layer 18 is formed using MOCVD in the current embodiment. The a-plane nitride layer 18 is formed through the same method as that described above with reference to FIGS. 1 to 8. That is, the a-plane nitride layer 18 including the nucleation layer 12, the first buffer layer 13, the lateral growth layer 14, the silicon nitride layer 15 and the second buffer layer 17, which are sequentially formed, is formed on the base substrate 11 on which the dielectric layer pattern 210 is formed.

More specifically, the nucleation layer 12 is formed on the base substrate 11 on which the dielectric layer pattern 210 is formed (S267). Here, the nucleation layer 12 is formed in a nitrogen or hydrogen ambient at a pressure in the range of 30 to 760 torr, a V/III ratio in the range of 50 to 3000 and a temperature in the range of 450 to 1300° C. The thickness of the nucleation layer 12 affects the crystallinity of the a-plane nitride layer 18 formed thereon, and thus the nucleation layer 12 is formed to a thickness in the range of 5 to 700 nm, preferably, in the range of 70 to 250 nm. Here, the nucleation layer 12 may be formed of one of GaN, $Al_xGa_{1-x}N$ and $In_xGa_{1-y}N$ (0<x, y>1). The nitride-based nucleation layer 12 uses a-plane GaN in the current embodiment of the invention.

Then, the first buffer layer 13 is formed on the nucleation layer 12 (S269). The first buffer layer 13 is grown on the nucleation layer 12 faster in the vertical direction than in the lateral direction. The first buffer layer 13 is grown at a V/III ratio in the range of 50 to 2000, a pressure in the range of 100 to 760 torr, and a temperature in the range of 450 to 1300° C. Although the first buffer layer 13 grown under this condition has a rough surface, an FWHM value of the a-plane scanned with XRD in a direction parallel with the m axis is reduced.

Subsequently, the lateral growth layer 14 is formed on the first buffer layer 13. The lateral growth layer 14 is grown faster in the lateral direction than in the vertical direction. The lateral growth layer 14 is grown at a V/III ratio in the range of 2 to 1000, a temperature in the range of 800 to 1500° C., and a pressure in the range of 10 to 300 torr. The lateral growth layer 14 is grown at a V/III ratio lower than that at which the first buffer layer 13 is grown. The lateral growth layer 14 formed under this condition has a mirror-like surface, and an FWHM value of the a-plane scanned with XRD in a direction parallel with the c axis is reduced. This represents that GaN grown in the c-axis direction has satisfactory crystallinity. In addition, it can be confirmed that an FWHM value of the a-plane scanned with XRD in a direction parallel with the c axis is reduced.

The silicon nitride ($SiN_x$) layer 15 having a plurality of holes 16 is formed on or in the lateral growth layer 14 or at the interference between the first buffer layer and the lateral growth layer (S273). That is, the silicon nitride layer 15 is formed on or in the lateral growth layer 14, or at the interface between the first buffer layer and the lateral growth layer using $SiH_4$, or $Si_2H_6$ and $NH_3$ in a state that supply of III-group elements, Ga, In and Al, is interrupted in MOCVD equipment. At this time, the silicon nitride layer 15 generates the plurality of holes 16 by itself and exposes the lateral growth layer 14 formed therebeneath through the holes 16.

Subsequently, the second buffer layer 17 covering the silicon nitride layer 15 is formed to complete the heterogeneous substrate 10 on which a nitride is deposited (S275). The second buffer layer 17 is grown in an ambient at a V/III ratio in the range of 50 to 2000, a temperature in the range of 450 to 1300° C., and a pressure in the range of 30 to 760 torr, and doped with Si for an n-type semiconductor if required. The second buffer layer 17 needs to have lateral and vertical growth rates equal to each other or a lateral growth rate higher than a vertical growth rate. It can be confirmed that the second buffer layer 17 grown under this condition maintains a mirror-like surface and improved crystallinity. At this time, the nucleation layer 12, the first buffer layer 13, the lateral growth layer 14, the silicon nitride layer 15, and the second buffer layer 17, formed on the base substrate 11, form the a-plane nitride layer 18.

Particularly, the second buffer layer 17 or lateral growth layer is grown on the layer 14 exposed through the holes 16 of the silicon nitride layer 15 to cover the silicon nitride layer 15. That is, crystals are not directly grown on the silicon nitride layer 15 and they are grown through portions of the layer 14, exposed via the holes 16 of the silicon nitride layer 15. At this time, the crystals are grown faster in the lateral direction L than in the vertical direction V, as shown in FIGS. 7 and 8, to cover the silicon nitride layer 15, and thus the second buffer layer 17 having a flat surface is formed and crystallinity there of is improved.

In the current embodiment as described above, it is possible to form the a-plane nitride layer 18 having a flat surface and a small amount of internal defects on the non-polar or semi-polar plane of the base substrate 11 by controlling the crystal growth mode. That is, the nucleation layer 12 is formed on the base substrate 11, the first buffer layer 12 is formed on the nucleation layer 12 such that it is grown faster in the vertical direction than in the lateral direction, the lateral growth layer 14 is formed on the first buffer layer 12 such that it is grown faster in the lateral direction than in the vertical direction, and then the second buffer layer 17 is formed on the lateral growth layer 14, to thereby form the a-plane nitride layer 18 having a flat surface and a small amount of internal defects on the base substrate 11. Particularly, the silicon nitride layer 15 having the plurality of holes 16 is formed between the lateral growth layer 14 on the first buffer layer 13 and the second buffer layer 17, and then crystals are grown through the holes of the silicon nitride layer 15 to promote growth of the crystals in the lateral direction, thereby forming the a-plane nitride layer 18 having a flat surface and a small amount of internal defects.

While the silicon nitride layer 15 is formed on the lateral growth layer 14 in step S273 in the current embodiment, the present invention is not limited thereto. For example, the silicon nitride layer 15 may be formed on the interface of the first buffer layer, the lateral growth layer or the second buffer layer, or in the first buffer layer, lateral growth layer or the second buffer layer. That is, the silicon nitride layer may be formed in the lateral growth layer. Specifically, a first lateral growth layer is formed on the first buffer layer, first. Then, the silicon nitride layer having a plurality of holes uniformly distributed therein is formed on the first lateral growth layer. The first lateral growth layer exposed through the holes of the silicon nitride layer is grown to form a second lateral growth layer covering the silicon nitride layer.

Alternatively, the silicon nitride layer may be formed in the second buffer layer. Specifically, a (2-1)th buffer layer is formed on the lateral growth layer, and then the silicon nitride layer having a plurality of holes uniformly distributed therein is formed on the (2-1)th buffer layer. Subsequently, the (2-1) th buffer layer exposed through the holes of the silicon nitride layer is grown to form a (2-2)th buffer layer covering the silicon nitride layer.

Preferably, the silicon nitride layer 15 is formed between the lateral growth layer 14 on the first buffer layer 13 and the second buffer layer 17. Alternatively, the silicon nitride layer may not be formed when the a-plane nitride layer is formed on the r-plane of the base substrate 11.

According to another embodiment of the invention as described above, the dielectric layer patterns 210 having a refractive index different from that of the base substrate 11 is formed on the base substrate 11. Then, the a-plane nitride layer 18 is grown through the same method as the above-described embodiment with reference to FIGS. 1 to 8 to form the heterogeneous substrate 100. That is, the a-plane nitride layer can be formed with an increased lateral growth rate so as to obtain a flat surface of the a-plane nitride layer.

Figure 25:
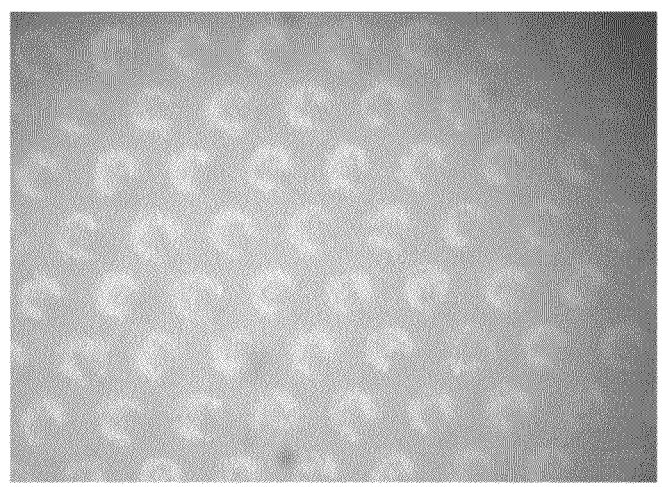
FIG. 25 is an optical microscope photograph of the surface of the heterogeneous substrate manufactured according to another embodiment of the present invention.
Figure 26:
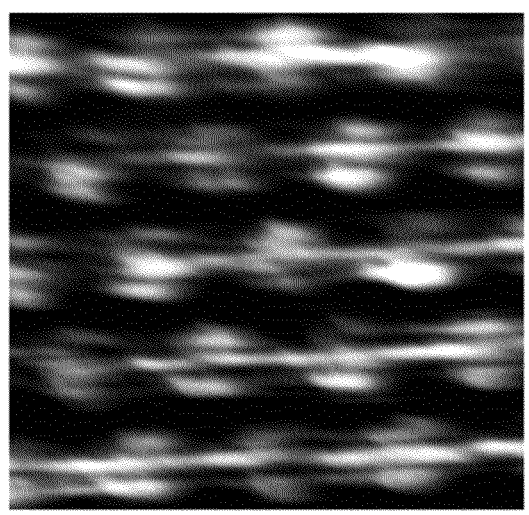
FIG. 26 is a Cathode Luminescence (CL) photograph of a specimen of the heterogeneous substrate manufactured according to another embodiment of the present invention.

FIG. 25 is a photograph of the surface of the heterogeneous substrate according to another embodiment of the invention, observed using an optical microscope. Referring to FIG. 25, it can be observed the a-plane nitride layer on the surface of the base substrate 11 and the dielectric layer pattern 210 formed on the base substrate 11 under the a-plane nitride layer due to a refractive index difference. FIG. 26 is a photograph of a specimen of the heterogeneous substrate manufactured according to another embodiment of the invention, observed using Cathode Luminescence (CL). As shown in FIG. 26, the a-plane nitride layer 18 on the dielectric layer pattern 210 has very high quality.

Figure 27:
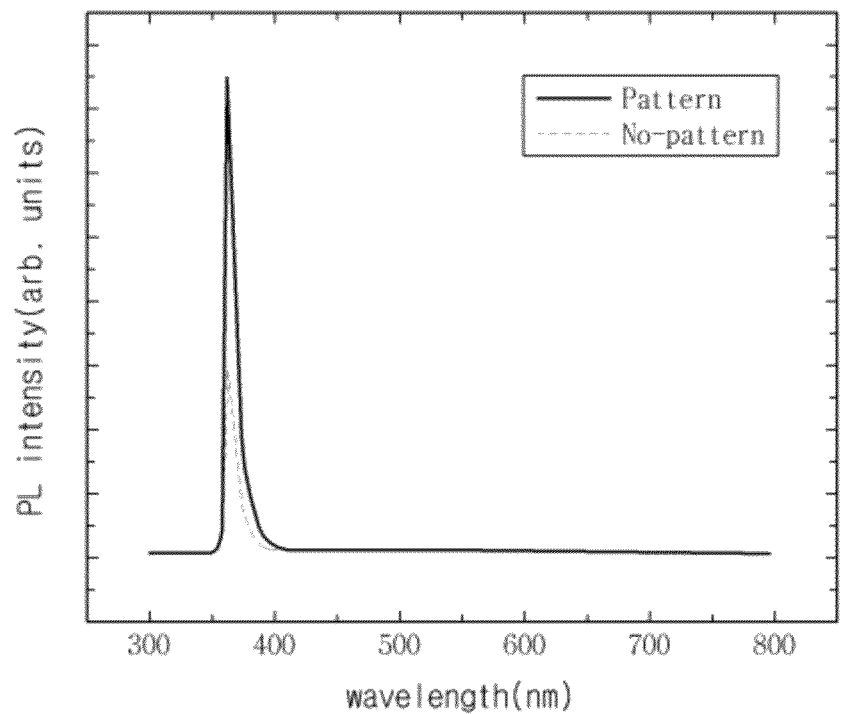
FIG. 27 is a graph showing a result of observation of emission intensity for each position, obtained through micro-Photo-Luminescence (PL)

There are two methods of emitting a larger amount of light from general semiconductor light-emitting devices. One of them forms an Epitaxial Lateral Over Growth (ELOG) (also referred to as ELO, LEO and PENDEO) on a base substrate using a pattern and the other is a patterned sapphire substrate (PSS) method that changes an optical path difference to increase the amount of emitted light. However, the method that forms ELOG needs to form a nitride layer on the base substrate, form the pattern on the nitride layer, and form a nitride layer thereon. That is, re-growth is required to improve crystallinity. Furthermore, the PSS method must etch the base substrate. In accordance with another embodiment of the present invention, however, the base substrate 11 does not need to be etched, and a larger amount of light can be emitted by adding a simple process of forming the dielectric layer pattern 210 on the base substrate 11. FIG. 27 is a graph showing a result of observation of emission intensity for each position, obtained through micro-Photo-Luminescence (PL). It can be observed from FIG. 27 that a larger amount of light are emitted from the region on the dielectric layer pattern.

The above-mentioned heterogeneous substrate on which a nitride is deposited according to another embodiment of the invention can be used as a substrate for various electronic devices including light emitting elements such as LED, LD, etc.

Figure 28:
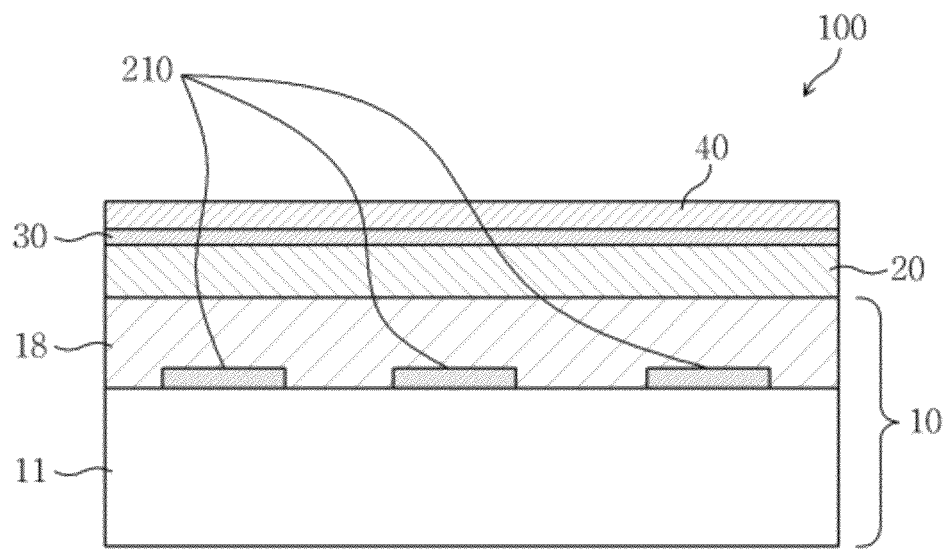
FIG. 28 is a cross-sectional view of a nitride-based semiconductor device using the heterogeneous substrate on which a nitride is deposited, manufactured according to another embodiment of the present invention.

FIG. 28 is a cross-sectional view of a nitride-based semiconductor device 100 using the heterogeneous substrate 10 on which a nitride is deposited according to another embodiment of the invention.

Referring to FIG. 28, the semiconductor device 100 is formed on the heterogeneous substrate 10 on which the dielectric layer pattern 210 is formed according to another embodiment of the invention. The semiconductor device 100 is an LED having a structure in which a first nitride layer 20, an active layer 30 and a second nitride layer 40 are sequentially formed on the a-plane nitride layer 18 of the heterogeneous substrate 10. The a-plane nitride layer 18 has a thickness of 4 µm approximately. The first nitride layer 20 is an n-type semiconductor including an n-type dopant, and a III-V group nitride-based compound semiconductor of n-GaN group may be used as the first nitride layer 20. The first nitride layer 20 may be formed to a thickness of about 2 µm. The active layer 30 may be formed of InGaN/GaN 4QWs on the first nitride layer 20 to a thickness of 4 nm/10 nm. The second nitride layer is a p-type semiconductor including a p-type dopant, and a III-V group nitride-based compound semiconductor of p-GaN group may be used as the second nitride layer. The second nitride layer 40 may be formed to a thickness of about 150 nm.

While the n-type first nitride layer 20, the active layer 30 and the p-type second nitride layer 40 are sequentially formed on the a-plane nitride layer 18 in the current embodiment, the present invention is not limited thereto. For example, the nitride-based semiconductor device may have a structure in which a p-type first nitride layer, an active layer and an n-type second nitride layer are formed on the a-plane nitride layer.

Figure 29:
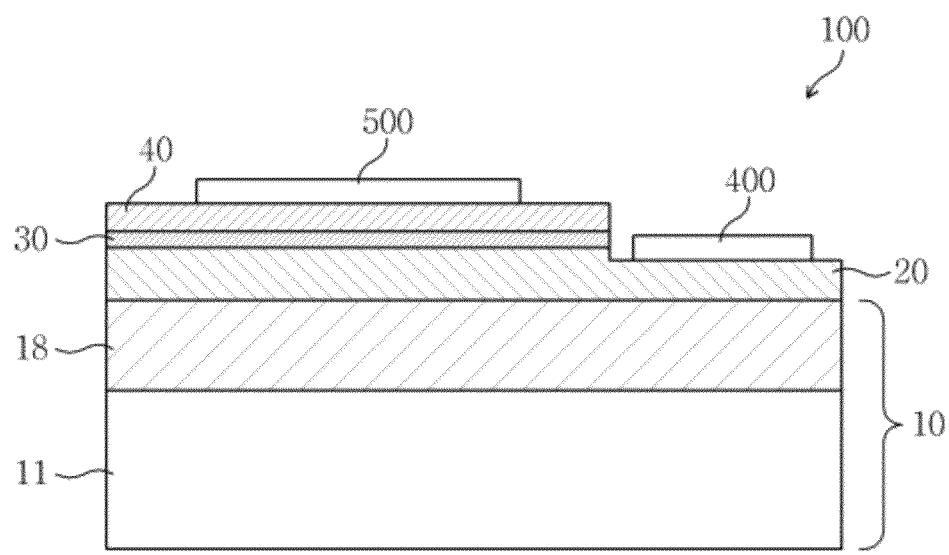
FIG. 29 is a cross-sectional view for explaining a semiconductor device formed on the heterogeneous substrate according to an embodiment of the present invention.

FIG. 29 is a view for explaining a semiconductor device formed on the heterogeneous substrate according to an embodiment of the present invention.

Referring to FIGS. 14, 28 and 29, in the structure in which the heterogeneous substrate 10, the first nitride layer 20, the active layer 30 and the second nitride layer 40 are sequentially laminated, the second nitride layer 40, the active layer 30 and the first nitride layer 20 are etched such that a portion of the first nitride layer 20 is exposed, as shown in FIGS. 14 and 28. Then, electrodes 400 and 500 are formed on the first nitride layer 20 and the second nitride layer 40 to accomplish a light-emitting element. FIG. 29 shows that the electrodes 400 and 500 are formed on the semiconductor device 100 shown in FIG. 14 or 28. The electrodes 400 and 500 may be n-type and p-type electrodes depending on dopant types of the first nitride layer 20 and the second nitride layer 40. For convenience, it is assumed that the first nitride layer and the second nitride layer are respectively doped with n-type and p-type dopants, and thus the electrode 400 is an n-type electrode and the electrode 500 is a p-type electrode. However, the electrode 400 may be a p-type electrode and the electrode 500 may be an n-type electrode depending on the dopant types of the first nitride layer 20 and the second nitride layer 40.

The above-described semiconductor device has stacking fault since it is a GaN light-emitting element formed on the a-plane ({11-20} plane) or m-plane ({1-100} plane) instead of the c-plane ({0001} plane). This stacking fault decreases the optical output power of the device and obstructs smooth flow of current to thereby deteriorate the reliability of the device. That is, a conventional GaN light-emitting element formed on the c-plane ({0001} plane) has a lot of defects to result in deterioration of the optical efficiency and reliability of the light-emitting element. Defects present in a GaN thin film include threading dislocation and stacking fault. While the first nitride layer 20 and the second nitride layer 40 have a wurtzite structure, basal stacking fault has a zinc blend structure. Accordingly, the stacking fault has an energy band gap slightly smaller than that of the wurtzite structure, and thus a potential barrier is formed at the interface between wurtzite GaN and stacking fault. The stacking fault does not largely affect the conventional GaN light-emitting element since the stacking fault is grown in parallel with the c-plane. However, the stacking fault is grown vertically penetrating the a-plane or m-plane in the case of a non-polar or semi-polar GaN light-emitting element, as shown in FIGS. 14 and 28, because the stacking fault is grown on the a-plane or m-plane, differently from the conventional GaN light-emitting element. Therefore, the stacking fault largely affects the optical and electrical characteristics of the non-polar or semi-polar GaN light-emitting element.

When a non-polar or semi-polar GaN light-emitting element is formed on the a-plane or m-plane instead of the c-plane using a conventional device manufacturing method, the stacking fault generates a problem in current spreading to reduce the optical output power of the element and deteriorate the reliability of the element. Accordingly, when the non-polar or semi-polar GaN light-emitting element is manufactured in an embodiment of the present invention, an electrode pattern of the non-polar or semi-polar GaN light-emitting element is formed in consideration of the stacking fault.

Figure 30:
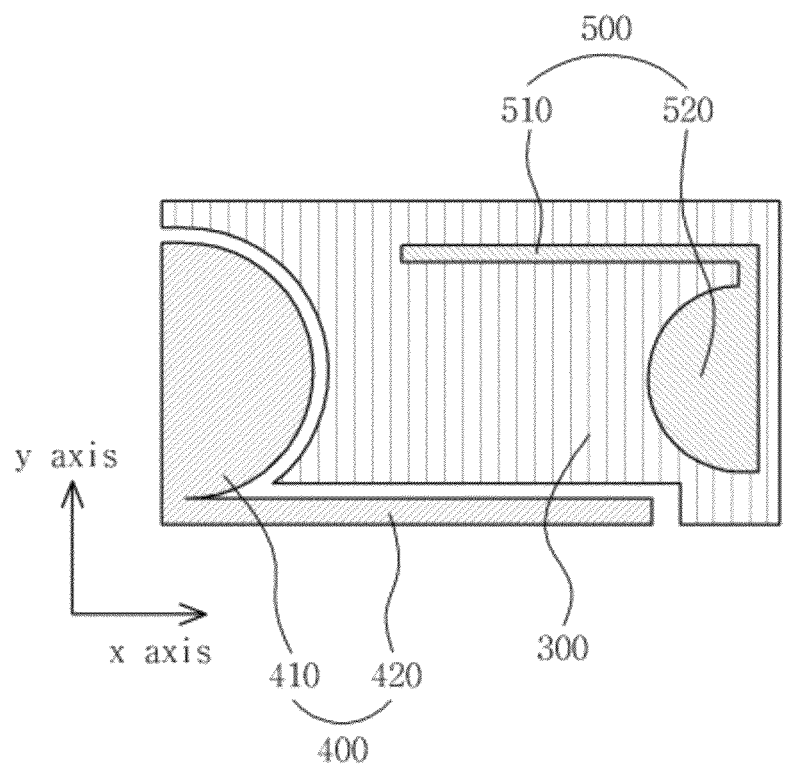
FIGS. 30 and 31 are views for explaining an electrode pattern according to an embodiment of the present invention.
Figure 31:
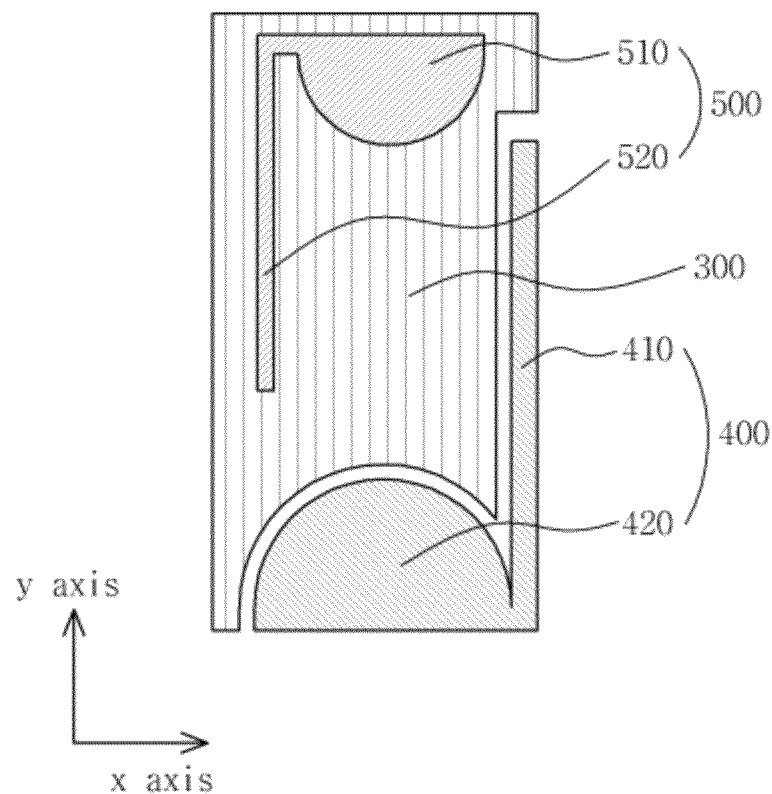

FIGS. 30 and 31 are views for explaining an electrode pattern according to an embodiment of the invention.

FIGS. 30 and 31 are plan views of the semiconductor device 100 formed on the heterogeneous substrate 10. Reference numeral 300 denotes basal stacking faults formed in the y-axis direction, 400 denotes an n-type element, and 500 denotes a p-type electrode.

The stacking faults 300 act as a resistance component that obstructs movement of carriers in the vertical direction (x-axis direction) of the stacking faults. That is, the stacking faults 300 are grown in a direction perpendicular to the c-axis ({0001} axis) direction so as to obstruct flow of carriers in the c-axis direction.

A semiconductor device is manufactured in such a manner that a wafer is cut into a plurality of rectangular devices. If this rectangular semiconductor device (200×500 $\mu m^2$, in general) is manufactured in a direction parallel with the y axis, as shown in FIG. 30, carriers are moved in the x-axis direction. Here, the x-axis corresponds to c axis when the semiconductor device is formed on a non-polar heterogeneous substrate such as the heterogeneous substrate according to the present invention. However, flow of the carriers is obstructed by the stacking faults 300 grown in a direction perpendicular to the x axis to increase the resistance. On the other hand, the rectangular semiconductor device is manufactured in the y-axis direction, as shown in FIG. 31, the carriers can be moved in the y-axis direction without being obstructed by the stacking faults 300, and thus a resistance component is not additionally generated. Furthermore, the stacking faults 300 have a zinc blend structure while the first and second nitride layers 20 and 40 have a wurtzite structure, and thus the stacking faults 300 have an electron effective mass of me*=0.17 $m_0$, which corresponds to about 20% of that of GaN in the wurtzite structure. Accordingly, although the carriers act as a resistance component when moved in the x-axis direction, the y axis may be a shortcut through which the carriers can be moved. Therefore, the electrode pattern is formed such that the carriers can be moved in the y-axis direction instead of the x-axis direction in the embodiment of the invention.

Referring to FIGS. 30 and 31, the n-type and p-type electrodes 400 and 500 are patterned such that they are opposite to each other on the basis of the x axis and y axis.

Accordingly, when a rectangular semiconductor device having a longer side in the x-axis direction is formed, as shown in FIG. 30, carriers are moved through portions 410 and 510 where the n-type electrode 400 and the p-type electrode 500 are opposite to each other on the basis of the y axis since the stacking faults 300 act as a resistance component that obstructs the movement of the carriers.

In addition, when a rectangular semiconductor device having a longer side in the y-axis direction is formed, as shown in FIG. 31, carriers are moved through portions 420 and 520 where the n-type electrode 400 and the p-type electrode 500 are opposite to each other on the basis of the y axis since the stacking faults 300 act as a resistance component that obstructs the movement of the carriers.

Figure 32:
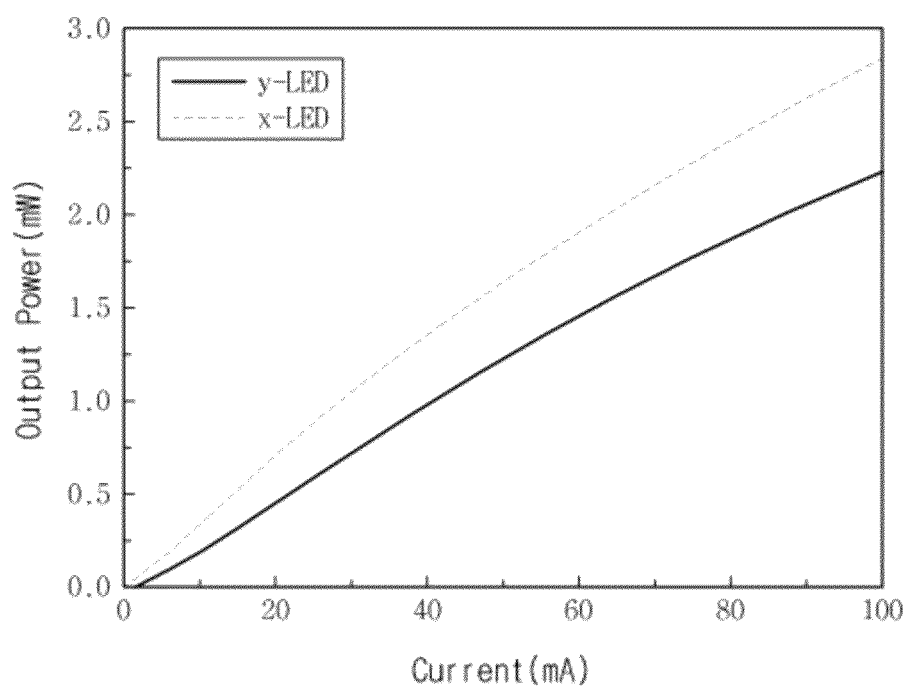
FIG. 32 is a graph showing an optical output power difference in an axial direction between semiconductor devices shown in FIGS. 30 and 31.

FIG. 32 is a graph showing an optical output power difference in the axial direction between the semiconductor devices shown in FIGS. 30 and 31.

Here, the semiconductor device shown in FIG. 30 is referred to as an x-LED and the semiconductor device shown in FIG. 31 is referred to as a y-LED, for convenience. Since a moving distance of carriers in the x-LED is shorter than that in the y-LED due to the stacking faults 300, the output power of a semiconductor device is further improved if the semiconductor device is manufactured in a rectangular shape having a longer side in the x-axis direction as is the x-LED. Therefore, it is preferable to manufacture a semiconductor device in a rectangular shape having a longer side in the x-axis direction, as shown in FIG. 30.

Figure 33:
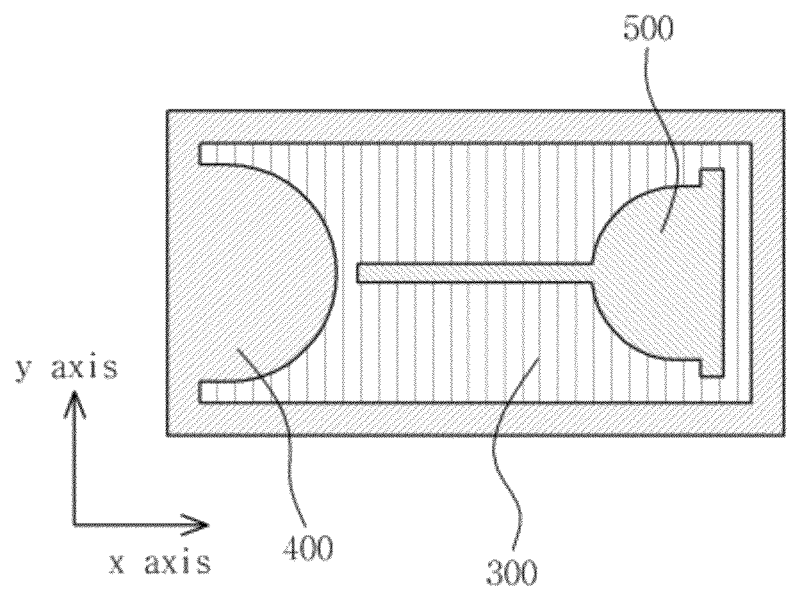
FIG. 33 is a view for explaining an electrode pattern according to another embodiment of the present invention.

FIG. 33 is a view for explaining an electrode pattern according to another embodiment of the invention.

FIG. 33 is a plan view of the semiconductor device 100 formed on the heterogeneous substrate 10. As shown in FIG. 33, an electrode pattern according to another embodiment of the invention is formed in such a manner that the n-type electrode 400 surrounds the p-type electrode 500, and the p-type electrode 500 is formed long in the x-axis direction. Accordingly, though flow of carriers in the x-axis direction is obstructed by the stacking faults 300, the carriers can be easily moved in the y-axis direction. For this smooth current spreading, the n-type electrode 400 can be arranged on both sides of the p-type electrode 500 such that current can be applied more effectively.

As described above, in the case of the non-polar light-emitting element according to the present invention, the light-emitting element is manufactured in a rectangular form having a longer side in the x-axis direction such that current flows smoothly so as to reduce sheet resistance of the n-type electrode 400. In addition, the electrodes are patterned in such a manner that the n-type electrode surrounds the p-type electrode to effectively apply electrons, thereby improving output power of the light-emitting element.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A heterogeneous substrate on which a nitride is deposited, comprising:
   a base substrate having one of a non-polar plane and a semi-polar plane;
   a nitride-based nucleation layer formed on the plane of the base substrate;
   a first buffer layer formed on the nucleation layer such that the first buffer layer is grown faster in a vertical direction than in a lateral direction;
   a lateral growth layer formed on the first buffer layer such that the lateral growth layer is grown faster in the lateral direction than in the vertical direction; and
   a second buffer layer grown on the lateral growth layer.

2. The heterogeneous substrate on which a nitride is deposited according to claim 1, further comprising at least one silicon nitride ($SiN_x$) layer having a plurality of holes, which is formed at an interface of the first buffer layer, the lateral growth layer or the second buffer layer, or in the first buffer layer, the lateral growth layer or the second buffer layer,
   wherein crystals beneath the silicon nitride layer are grown through the holes of the silicon nitride layer to cover the silicon nitride layer.

3. The heterogeneous substrate on which a nitride is deposited according to claim 2, wherein the silicon nitride layer is formed between the lateral growth layer on the first buffer layer and the second buffer layer.

4. The heterogeneous substrate on which a nitride is deposited according to claim 3, wherein the base substrate is a sapphire board.

5. The heterogeneous substrate on which a nitride is deposited according to claim 4, wherein the non-polar or semi-polar plane corresponds to one of a-plane, r-plane and m-plane.

6. The heterogeneous substrate on which a nitride is deposited according to claim 5, wherein the nitride-based nucleation layer corresponds to a non-polar or semi-polar nitride-based single crystal.

7. The heterogeneous substrate on which a nitride is deposited according to claim 6, wherein the nitride-based nucleation layer corresponds to one of GaN, $Al_xGa_{1-x}N$, and $In_xGa_{1-y}N$ (0<x, y>1).

8. The heterogeneous substrate on which a nitride is deposited according to claim 7, wherein the nitride-based nucleation layer is grown in a nitrogen or hydrogen ambient at a temperature in the range of 450 to 1300° C., a pressure in the range of 30 to 760 torr, and a V/III ratio in the range of 50 to 3000.

9. The heterogeneous substrate on which a nitride is deposited according to claim 8, wherein the first buffer layer is grown at a V/III ratio in the range of 50 to 2000, a temperature in the range of 450 to 1300° C., and a pressure in the range of 100 to 760 torr.

10. The heterogeneous substrate on which a nitride is deposited according to claim 9, wherein the lateral growth layer is grown at a V/III ratio in the range of 2 to 1000, a temperature in the range of 800 to 1500° C., and a pressure in the range of 10 to 300 torr.

11. The heterogeneous substrate on which a nitride is deposited according to claim 10, wherein the second buffer layer is grown at a V/III ratio in the range of 50 to 2000, a temperature in the range of 450 to 1300° C., and a pressure in the range of 30 to 760 torr.

12. The heterogeneous substrate on which a nitride is deposited according to claim 11, wherein the nitride-based nucleation layer has a thickness in the range of 5 to 700 nm.

13. The heterogeneous substrate on which a nitride is deposited according to claim 1, further comprising a dielectric layer pattern having a refractive index different from that of the base substrate and formed on the base substrate.

14. The heterogeneous substrate on which a nitride is deposited according to claim 13, wherein the dielectric layer pattern corresponds to one of $SiO_2$ and SiN.

15. A nitride-based semiconductor device comprising:
    a heterogeneous substrate on which a nitride is deposited, the heterogeneous substrate including:
        a base substrate having one of a non-polar plane and a semi-polar plane;
        a nitride-based nucleation layer formed on the plane of the base substrate;
        a first buffer layer formed on the nucleation layer such that the first buffer layer is grown faster in a vertical direction than in a lateral direction;
        a lateral growth layer formed on the first buffer layer such that the lateral growth layer is grown faster in the lateral direction than in the vertical direction; and
        a second buffer layer grown on the lateral growth layer;
    an n-type or p-type first nitride layer formed on the second buffer layer of the heterogeneous substrate;
    an active layer formed on the first nitride layer; and
    a second nitride layer formed on the active layer and having a conductivity type opposite to that of the first nitride layer.

16. The nitride-based semiconductor device according to claim 15, further comprising first and second electrodes respectively bonded to the first and second nitride layers.

17. The nitride-based semiconductor device according to claim 16, wherein the first and second electrodes are formed opposite to each other in a direction perpendicular to c axis.

18. The nitride-based semiconductor device according to claim 16, wherein the first and second electrodes are formed in such a manner that an n-type electrode surrounds a p-type electrode.

19. A method for manufacturing a heterogeneous substrate on which a nitride is deposited, the method comprising the steps of:
    preparing a base substrate having one of a non-polar plane and a semi-polar plane;
    forming a nitride-based nucleation layer on the plane of the base substrate;
    forming a first buffer layer on the nucleation layer such that the first buffer layer is grown faster in a vertical direction than in a lateral direction;
    forming a lateral growth layer on the first buffer layer such that the lateral growth layer is grown faster in the lateral direction than in the vertical direction; and
    growing a second buffer layer on the lateral growth layer.

20. The method according to claim 19, wherein the base substrate is a sapphire board, and the non-polar or semi-polar plane corresponds to one of a-plane, r-plane and m-plane.

21. The method according to claim 19, wherein the step of forming the lateral growth layer comprises the steps of:
    growing a first lateral growth layer on the first buffer layer;
    forming a silicon nitride layer having a plurality of holes on the first lateral growth layer; and
    growing the first lateral growth layer exposed through the holes of the silicon nitride layer to form a second lateral growth layer covering the silicon nitride layer.

22. The method according to claim 19, wherein the step of growing the second buffer layer comprises the steps of:
    growing a (2-1)th buffer layer on the lateral growth layer;
    forming a silicon nitride layer having a plurality of holes on the (2-1)th buffer layer; and
    growing the (2-1)th buffer layer exposed through the holes of the silicon nitride layer to form a (2-2)th buffer layer covering the silicon nitride layer.

23. The method according to claim 19, further comprising the step of forming a silicon nitride layer having a plurality of holes on the lateral growth layer after the step of forming the lateral growth layer,
    wherein the lateral growth layer exposed through the holes of the silicon nitride layer is grown to form the second buffer layer covering the silicon nitride layer in the step of growing the second buffer layer.

24. The method according to claim 19, further comprising the step of forming a dielectric layer pattern having a refractive index different from that of the base substrate on the base substrate after the preparing step and before the step of forming the nucleation layer.

25. The method according to claim 24, wherein the dielectric layer pattern corresponds to one of $SiO_2$ and SiN.

26. A method for manufacturing a nitride-based semiconductor device, the method comprising the steps of:
    manufacturing a heterogeneous substrate on which a nitride is deposited, including the steps of:
        preparing a base substrate having one of a non-polar plane and a semi-polar plane;
        forming a nitride-based nucleation layer on the plane of the base substrate;
        forming a first buffer layer on the nucleation layer such that the first buffer layer is grown faster in a vertical direction than in a lateral direction;
        forming a lateral growth layer on the first buffer layer such that the lateral growth layer is grown faster in the lateral direction than in the vertical direction; and growing a second buffer layer on the lateral growth layer;

forming an n-type or p-type first nitride layer on the second buffer layer of the heterogeneous substrate;

forming an active layer on the first nitride layer; and forming a second nitride layer having a conductivity type opposite to that of the first nitride layer on the active layer.

27. The method according to claim 26, further comprising the step of forming first and second electrodes respectively bonded to the first and second nitride layers on the first and second nitride layers.

28. The method according to claim 27, wherein the first and second electrodes are formed opposite to each other in a direction perpendicular to c axis.

29. The method according to claim 27, wherein the first and second electrodes are formed in such a manner that an n-type electrode surrounds a p-type electrode.

* * * * *